(12) United States Patent
Suwald

(10) Patent No.: US 9,317,164 B2
(45) Date of Patent: Apr. 19, 2016

(54) CAPACITIVE POSITION SENSOR SYSTEM

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 262 days.

(21) Appl. No.: 13/898,384

(22) Filed: May 20, 2013

(65) Prior Publication Data
US 2014/0152610 A1   Jun. 5, 2014

(30) Foreign Application Priority Data

May 25, 2012   (EP) ..................................... 12169581

(51) Int. Cl.
*G06F 3/044* (2006.01)
*G06F 3/041* (2006.01)
*G01D 5/24* (2006.01)
*H03K 17/96* (2006.01)

(52) U.S. Cl.
CPC ........ *G06F 3/044* (2013.01); *G01D 5/24* (2013.01); *G06F 3/0416* (2013.01); *H03K 17/9622* (2013.01); *H03K 2017/9602* (2013.01); *H03K 2217/96074* (2013.01)

(58) Field of Classification Search
CPC ................. G06F 3/044; G06F 3/0416–3/0418
See application file for complete search history.

(56) References Cited

U.S. PATENT DOCUMENTS

| | | | |
|---|---|---|---|
| 4,441,082 A * | 4/1984 | Haque .................. | H03G 1/0094 330/129 |
| 4,894,620 A | 1/1990 | Nagaraj | |
| 5,730,165 A | 3/1998 | Philipp | |
| 6,466,036 B1 | 10/2002 | Philipp | |
| 8,095,091 B1 * | 1/2012 | Kopikare ............. | H03G 3/3042 455/115.1 |
| 2003/0132764 A1 | 7/2003 | Fasen | |
| 2010/0289772 A1 * | 11/2010 | Miller .................. | G06F 3/0421 345/175 |
| 2011/0082390 A1 * | 4/2011 | Krieter ................. | A61B 5/1036 600/587 |
| 2011/0193817 A1 * | 8/2011 | Byun .................... | G06F 3/0418 345/174 |
| 2011/0273400 A1 * | 11/2011 | Kwon ................... | G06F 3/0416 345/174 |
| 2013/0086389 A1 | 4/2013 | Suwald | |

FOREIGN PATENT DOCUMENTS

WO   2004/040240 A1   5/2004

OTHER PUBLICATIONS

Gregorian, R. et al. "Switched-Capacitor Circuit Design", Proceedings of the IEEE, vol. 71, No. 8, p. 941-966 (Aug. 1983).
"QMatrix QT60040 4-Key Charge-Transfer IC", Quantum Research Group Ltd, 10 pgs retrieved from the internet at: home.comcast.net/~rfpowerdude/MegaSquirt/QT60040.pdf (2000).
"QSlide, 16-Key QMatrix Sensor IC AT42QT2160", Atmel, 49 pgs retrieved from the internet at: www.atmel.com/Images/AT42QT2160_DS.pdf (2008).
Extended European Search Report for Patent Appln. No. 12169581.1 (Oct. 16, 2012).

* cited by examiner

*Primary Examiner* — Dwayne Bost
*Assistant Examiner* — Christopher Kohlman

(57) ABSTRACT

A capacitive position sensor system is provided for determining the position of an object, wherein the object is positioned within a sensitive area of the capacitive position sensor system and changes the capacitance of capacitors being arranged underneath the object.

18 Claims, 12 Drawing Sheets

| STEP | S11H | S11L | S12H | S12L | S13H | S13L | S2H | S2L | S3H | S3L | FUNCTION |
|------|------|------|------|------|------|------|-----|-----|-----|-----|----------|
| A    | X    | --   | X    | --   | X    | --   | --  | X   | --  | X   | Reset Cint |
| B1   | --   | X    | X    | --   | X    | --   | X   | --  | --  | --  | Reset Cs2, Cs3 |
| C1   | --   | X    | X    | --   | X    | --   | --  | --  | --  | --  | Disconnect Node Z |
| D1   | --   | X    | X    | --   | X    | --   | --  | --  | --  | X   | Charge Cint |
| E    | --   | X    | --   | X    | --   | X    | --  | --  | --  | X   | Reverse C2, C3 |
| F    | --   | X    | --   | X    | --   | X    | --  | --  | --  | X   | Measure Cint |
| G    | --   | X    | --   | X    | --   | X    | --  | --  | --  | --  | Disconnect Cint |
| A    | X    | --   | X    | --   | X    | --   | --  | X   | --  | X   | Reset Cint |
| B2   | X    | --   | --   | X    | X    | --   | X   | --  | --  | --  | Reset Cs1, Cs3 |
| C2   | X    | --   | --   | X    | X    | --   | --  | --  | --  | --  | Disconnect Node Z |
| D2   | X    | --   | --   | X    | X    | --   | --  | --  | --  | X   | Charge Cint |
| E    | --   | X    | --   | X    | --   | X    | --  | --  | --  | X   | Reverse C1, C3 |
| F    | --   | X    | --   | X    | --   | X    | --  | --  | --  | X   | Measure Cint |
| G    | --   | X    | --   | X    | --   | X    | --  | --  | --  | --  | Disconnect Cint |
| A    | X    | --   | X    | --   | X    | --   | --  | X   | --  | X   | Reset Cint |
| B3   | X    | --   | X    | --   | --   | X    | X   | --  | --  | --  | Reset Cs1, Cs2 |
| C3   | X    | --   | X    | --   | --   | X    | --  | --  | --  | --  | Disconnect Node Z |
| D3   | X    | --   | X    | --   | --   | X    | --  | --  | --  | X   | Charge Cint |
| E    | --   | X    | --   | X    | --   | X    | --  | --  | --  | X   | Reverse C1, C2 |
| F    | --   | X    | --   | X    | --   | X    | --  | --  | --  | X   | Measure Cint |
| G    | --   | X    | --   | X    | --   | X    | --  | --  | --  | --  | Disconnect Cint |
| H    | --   | X    | --   | X    | --   | X    | --  | --  | --  | --  | Calculate |

Fig. 3

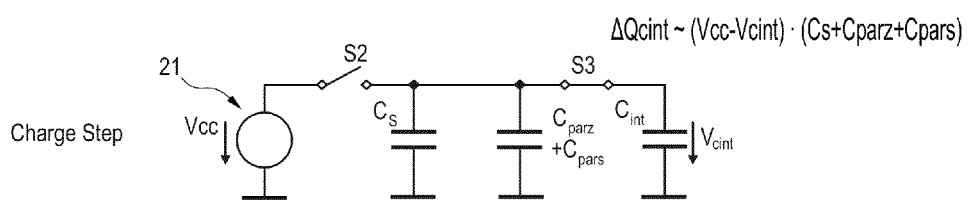

Charge Step $\Delta Q_{cint} \sim (V_{cc} - V_{cint}) \cdot (C_s + C_{parz} + C_{pars})$

Fig. 4

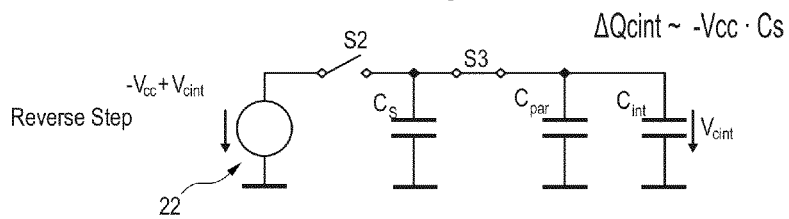

Reverse Step $\Delta Q_{cint} \sim -V_{cc} \cdot C_s$

Fig. 5

CAPACITIVE POSITION SENSOR SYSTEM

CROSS-REFERENCE TO RELATED APPLICATIONS

This application claims the priority under 35 U.S.C. §119 of European patent application no. 12169581.1, filed on May 25, 2012, the contents of which are incorporated by reference herein.

FIELD OF THE INVENTION

The invention relates to a capacitive position sensor system for determining the position of an object.

Beyond this, the invention relates to an electronic device.

Furthermore, the invention relates to a method of determining the position of an object.

Moreover, the invention relates to a computer-readable medium.

Beyond this, the invention relates to a program element.

BACKGROUND OF THE INVENTION

Many modern consumer devices require comfortable user data entry and proximity sensing interfaces which became very popular in devices like smart phones and portable media players. A variety of two-dimensional capacitive proximity position sensors are known. A common two-dimensional sensor implementation comprises a matrix organization of capacitive sensors that are driven by row- and column drive signals and the resulting coupled charge on a sensing node is measured to yield a measure for the capacitive coupling. A position is obtained by calculating the position's x- and y-component separately by applying a center-of-gravity formula that assigns weights to the sensor signals related to the position of the sensor itself. The sum of the weighted sensor activity levels is divided by the sum of all un-weighted activity levels, yielding the averaged x- and y-position components. A drawback of this approach is the need for a plurality of sensors that increase the complexity of interfacing with a controller circuit. The matrix approach results in a long conversion time as every sensor capacitors activity level has to be evaluated for the detection of a touch event.

The measurement principles applied in position sensing are many-fold. The following measurement principles are commonly applied: Capacitive Proximity Position Sensors, Resistive Position Sensors, Optical Position Sensors and Acoustical Position Sensors.

The first two principles are the most popular ones and cover in total more than 90% of all position sensing applications. The measurement of touch dependent resistances and proximity dependent capacitances is utilized to obtain the position information by numerical post-processing. An integrator circuit is used to transform a resistance or a capacitance into timing information that can be captured by a microcontroller unit (MCU). The integrator is stimulated by an input signal and the resulting response is sampled and hold and evaluated by an MCU. Another common approach is to use a constant current to charge a capacitor under test and measure the time required to charge the capacitor to a predefined voltage. After the measurement, the capacitor is reset by a reset signal and a new charging cycle can be started. Another common method for capacitance measurement is to use a capacitor under test as timing element in a relaxation oscillator, resulting in a capacitance to frequency conversion. The resulting frequency is measured by a frequency measurement routine executed on a MCU.

The before mentioned measurement principles are not very flexible in terms of software-based configuration, especially a two-dimensional position calculation is not provided. Besides that, special analog circuitry is required to implement these measurement principles. Especially the integration of analog circuitry adds complexity to an existing digital design and moreover in many cases additional process options are required that add unwanted cost. Monolithic integrations of proximity sensing devices are available, but these devices contribute to the device count (BOM) of a target system and furthermore contribute to the power consumption of the target system. Two-dimensional proximity position sensor device (i.e. for touch screens) are generally high-pin-count devices.

A common capacitance measurement method is to use the capacitor under test as a frequency dependent resistor charging an integration capacitor in a switched capacitor integrator configuration. The basic principle is well known and documented, e.g., in the publications: Switched-Capacitor Circuit Design, R. Gregorian, et al, Proceedings of the IEEE, Vol 71, No. 8, August 1983 and Switched-Capacitor Circuit with Large Time Constant, Krishnaswamy Nagaraj, U.S. Pat. No. 4,894,620, Jan. 16, 1990.

Common implementations of switched capacitor based position sensing devices share the same approach wherein one sensing capacitor is evaluated at a time. In order to remove noise, an n-key-rollover scheme is applied that evaluates a sensor capacitance multiple times and applies a filter function on the sample series in order to remove high frequent noise components. This approach results in long processing time which is hardly acceptable, for example for online-handwriting recognition systems.

OBJECT AND SUMMARY OF THE INVENTION

It is an object of the invention to provide a capacitive position sensor system or method for providing an efficient way of determining the position of an object avoiding the above mentioned disadvantages.

In order to achieve the object defined above, a capacitive position sensor system, an electronic device, a determination method, a computer-readable medium and a program element according to the independent claims are provided.

According to an exemplary embodiment of the invention, a capacitive position sensor system is provided for determining the position of an object, wherein the object is positioned within a sensitive area of the capacitive position sensor system and changes the capacitance of capacitors being arranged underneath the object. The capacitive position sensor system comprises a first plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, a sensing unit, wherein the sensing unit is adapted to sense a voltage level representing the amount of charge being present on the sensing line, and a control unit, wherein the control unit is adapted to apply a drive signal to each of the switches being coupled to the first electrodes. In one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two. The control unit is adapted to determine the position of the object by analyzing the results of a plurality of sensed voltage levels of a plurality of integration cycles.

According to a further exemplary embodiment, an electronic device for receiving an input from a user is provided. The electronic device comprises the capacitive position sensor system having the above mentioned features, wherein the input corresponds to the positioning of an object of the user.

According to a further exemplary embodiment, a method of determining the position of an object is provided, wherein the object is positioned within a sensitive area of the capacitive position sensor system and changes the capacitance of capacitors being arranged underneath the object, wherein the capacitive position sensor system comprises a first plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line. The method comprises sensing, by a sensing unit, a voltage level representing the amount of charge being present on the sensing line, applying, by a control unit, a drive signal to each of the switches being coupled to the first electrodes, wherein, in one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two, determining, by the control unit, the position of the object by analyzing the results of a plurality of sensed voltage levels of a plurality of integration cycles.

According to a further exemplary embodiment, a computer-readable medium is provided, in which a computer program of determining the position of an object is stored, which computer program, when being executed by a processor, is adapted to carry out or control a method having the above mentioned features.

According to still another exemplary embodiment, a program element (for instance a software routine, in source code or in executable code) of determining the position of an object e is provided, which program element, when being executed by a processor, is adapted to carry out or control a method having the above mentioned features.

Determining the position of an object, which may be performed according to embodiments of the invention, can be realized by a computer program that is by software, or by using one or more special electronic optimization circuits, that is in hardware, or in hybrid form, that is by means of software components and hardware components.

The invention relates to position sensing devices. Particularly, the invention is related to position sensors utilizing capacitive proximity sensing.

More specifically, the invention describes a capacitive position sensor that can determine the position of a finger or a stylus on a non conducting surface in a one- or two-dimensional plane. Capacitance measurement may be implemented utilizing a switched capacitor integrator principle. According to this, a switched-capacitor filter structure is utilized for the implementation of a capacitance measurement function.

A sensing element may be implemented by using a proximity sensing capacitor being operated in a switched capacitor integrator configuration with the purpose of measuring the capacitance of the sensing capacitor. The sensor capacitor may be formed by two electrodes attached to a substrate. The electrodes may be very thin (3-50 μm) compared and very narrow (50-100 μm) and may have rounded edges. As a consequence, the direct plate capacitance of the sensing capacitor may be small compared to its fringe capacitance. An object, like a human finger, in close proximity with the substrate may cause a distortion of the fringe field of the sensing capacitor. This distortion may reduce the capacitance of the sensing capacitor.

According to this embodiment, assuming three parallel capacitors, the capacitance of two paralleled sensing capacitors out of the three sensing capacitors may be measured during one measurement instead of just one sensing capacitor as described in the prior art. As a consequence every measurement may yield the sum of two out of three sensor capacitances. Summing in this case may act as a FIR low-pass filter meant to remove high frequent noise like high frequent carrier residues in smartcard applications. Thus, the noise filtering may be carried out during one measuring or integration cycle and no further noise filter cycle may be needed.

The first drive signal as used herein may refer to a group of single drive signals, being associated to the first plurality of sensing elements. For instance, one drive signal may be associated with one sensing element.

In the following, further exemplary embodiments of the capacitive position sensor system will be explained. However, these embodiments also apply to the electronic device, the determination method, to the program element and to the computer-readable medium.

Analyzing the results of a plurality of sensed voltage levels may comprise computing the charge of each of the first capacitors. As per integration cycle the sum of the charges of more than one capacitor is measured, it might be needed to compute the charges per capacitor.

The sensing unit and the control unit may provide an n-tap FIR noise filter by driving at least two capacitors in one integration cycle.

The sampling method and system disclosed herein may economically implement position data sampling and noise filtering by implementing n-tap FIR noise filter support directly into the switched capacitor measurement unit. Together with a digital post-processing, an n-tap FIR function may be implemented. The implemented noise filtering may reduce the effort for separate data sample filtering, resulting in a speed advantage compared to prior art implementations.

The number of integration cycles may correspond to the number of capacitors. In each integration cycle, the combination of the sensed or measured capacitors may change. After the sampling or measuring, the charge for each single capacitor may be determined.

The sensing unit may comprise an integration capacitor being indicative for the sum of the amount of charge of the part of the first capacitors, and a comparator for comparing the voltage level sensed via the integration capacitor with a reference voltage.

The switches may be in conjunction with the sensing elements or capacitors of the sensing elements configured to periodically charge and discharge the integration capacitor. The amount of charge being coupled through the capacitors of the sensing elements into the integration capacitor may depend on the capacitance of the capacitors of the sensing elements and the actual voltage across the integration capacitor. The amount of charge being removed from the integration capacitor may depend on the capacitance of the capacitors of the sensing elements and may be independent of the actual voltage across the integration capacitor.

The comparator may be a general purpose input/output pin being controlled as a comparator and/or a voltage comparator.

Each of the switches may be a general purpose input/output pin being controlled as a switch.

Many modern consumer devices are equipped with powerful micro controller units (MCU) that offer a plurality of general purpose input/output interfaces or pins (GPIO). In many applications, not all of the many GPIOs are utilized by the application and may be made available for the implementation of a touch sensing algorithm.

A common capacitive proximity sensor device applies a pseudo dual slope integration scheme wherein the integration capacitor is charged in a switched capacitor integrator scheme to a negative voltage and discharged by a resistor to zero voltage. A timer determines the time required to discharge the capacitor. Due to the nature of integrated circuits the negative voltage level across the integration capacitor has to stay well below the threshold voltage of the implemented input protection diode to ground as otherwise the diode would start to conduct and unwanted discharge would occur. This behavior limits the integration voltage level and hence the signal to noise ratio and hence this implementation is not well suited for a GPIO-based implementation.

Another common capacitive proximity sensor device applies single charge transfer action that charges an integration capacitor through the sensing capacitor. In fact, due to undocumented parasitic effects the integration capacitor approaches an operation point where the added charge is equalized by parasitic effects which prohibits a further increase of the integration voltage. This behavior is not well suited for a GPIO-based implementation as it limits the available drive range too much.

The capacitive position sensor system may further comprise a second plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, wherein, in one integration cycle, a part of the switches being coupled to the first electrodes is closed so that a part of the first capacitors of the second plurality of sensing elements is driven by a second drive signal, wherein the sensing unit is adapted to sense the voltage level representing the sum of the amount of charge of the part of the first capacitors of the first plurality of sensing elements and the voltage level representing the sum of the amount of charge of the part of the first capacitors of the second plurality of sensing elements.

By using two sets of sensing elements, a two-dimensional sensor system may be provided. Each set of sensing elements may be driven by one driving signal. Thus, the number of needed driving signals may correspond to the number of the dimension.

The first and the second drive signal in this case may each correspond to a group of driving signals per set of sensing elements. The first drive signal may refer to a combination of all signals controlling the switches related to the sensing elements of the first plurality and the second drive signal may refer to a combination of all signals controlling the switches related to the sensing elements of the second plurality.

Each sensing element of the first plurality of sensing elements may comprise a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the second electrodes is closed so that a part of the second capacitors is driven by a second drive signal, wherein the sensing unit is adapted to sense the voltage level representing the sum of the amount of charge of the part of the first capacitors and the voltage level representing the sum of the amount of charge of the part of the second capacitors, wherein the control unit is adapted to determine the position of the object by analyzing the results of a plurality of sensed voltage levels for the first capacitors and the second capacitors of a plurality of integration cycles.

By using two capacitors per sensing element, a weighted summing function may be implemented. This is the core of the center-of-gravity position calculation algorithm. A direct implementation of the weighted summing function may reduce the requirement for drive signals to two for every dimension, resulting in a faster generation of position data and enabling higher position data sample rates.

The capacitive position sensor system may further comprise a second plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, wherein each sensing element of the second plurality of sensing elements comprises a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the first electrodes and a part of the switches being coupled to the second electrodes is closed so that a part of the first capacitors of the first plurality of sensing elements is driven by a first drive signal, a part of the second capacitors of the first plurality of sensing elements is driven by a second drive signal, a part of the first capacitors of the second plurality of sensing elements is driven by a third drive signal, and a part of the second capacitors of the second plurality of sensing elements is driven by a fourth drive signal, wherein the sensing unit is adapted to sense the voltage level representing the sum of the amount of charge of the part of the first capacitors of the first plurality of sensing elements, to sense the voltage level representing the sum of the amount of charge of the part of the second capacitors of the first plurality of sensing elements, to sense the voltage level representing the sum of the amount of charge of the part of the first capacitors of the second plurality of sensing elements, and to sense the voltage level representing the sum of the amount of charge of the part of the second capacitors of the second plurality of sensing elements, wherein the control unit is adapted to determine the position of the object by analyzing the results of a plurality of sensed voltage levels of a plurality of integration cycles.

Using the weighted summing function for a two-dimensional sensor system may lead to an efficient and fast determination of the position of the object. In one embodiment, the first capacitors of one set of sensing elements are weighted increasingly in one direction and the second capacitors of this set of sensing elements are weighted in an inverted way.

The first plurality of sensing elements may be arranged in rows and the second plurality of sensing elements may be arranged in columns to form a two-dimensional array. The first capacitors of the first plurality of sensing elements may be coupled in a meander form and the second capacitors of the first plurality of sensing elements may also be coupled in a meander form. This may provide a good cover of the sensitive area without the need for many drive signals.

In the following, further exemplary embodiments of the electronic device will be explained. However, these embodiments also apply to the capacitive position sensor system, the determination method, to the program element and to the computer-readable medium.

The electronic device may be a keypad, a smart card or a mobile device. Due to the low energy consumption based on the fact that less drive signals are needed, the capacitive position sensor system may be used for many applications having strict place or energy requirements. The herein described capacitive position sensor system may require less I/O ports and less external components compared to common one- and two-dimensional sensors based on matrixed arrays and can be implemented utilizing standard GPIOs, which may also allow to integrate the system into a keypad or smart card.

The capacitive position sensor system may be integrated in a secure element of the electronic device. The integration of position detection devices in security relevant target systems may have the disadvantage that interfacing signals have to be connected from the position sensing device to a secure element to deliver the position information. The position information might be security relevant, e.g., authentication information like online handwriting information that must not be intercepted by unauthorized thirds.

The capacitive position sensor system may be implemented in a security relevant environment. In order to prevent interception of position information the touch sensing circuitry may be part of a secure element.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 3 illustrates various functional steps being executed in the system of FIG. 1.

FIGS. 4 and 5 illustrate the charge transport to and from the integration capacitor during the charge step and the reverse step according to FIG. 3.

DESCRIPTION OF EMBODIMENTS

Figure 1:
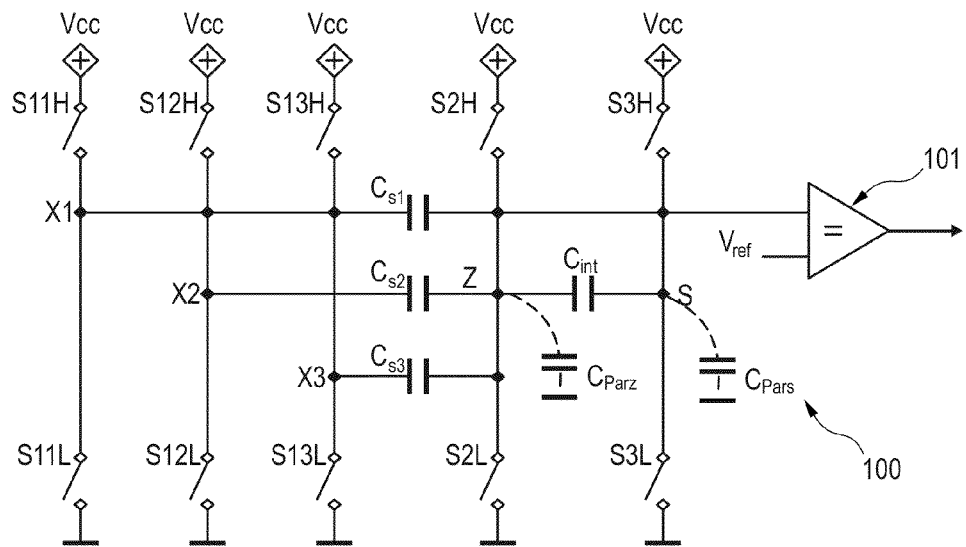
FIG. 1 illustrates a capacitive position sensor system according to an exemplary embodiment of the invention.

The illustration in the drawing is schematically. In different drawings, similar or identical elements are provided with the same reference signs.

Exemplary embodiments of the present invention will be described below. In an effort to provide a concise description of these exemplary embodiments, implementation details which fall into the customary practice of the skilled person may not have been described. It should be appreciated that in the development of any such implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

According to the herein described system and method, techniques are provided for an economic implementation of one- and two-dimensional tactile user interfaces in a mobile device. In some embodiments, the system and method utilizes a set of general purpose input output ports (GPIO) of a standard microcontroller unit (MCU) integrated into said device and at least one integration capacitor. A switched-capacitor filter structure is utilized for the implementation of a capacitance measurement function. If not otherwise mentioned a DC supply voltage named Vcc is assumed to be applied to the circuitries described herein.

FIG. 1 illustrates a capacitive position sensor system 100. This sensor system may also be called in the following complementary sampling unit. In the example given here, three sensor capacitors Cs1, Cs2 and Cs3 each representing a sensing element are used. Complementary sampling may be implemented with a suitable number of sensing capacitors that should be larger than one. The circuit may also be configured such that two or any other number up to two less than the available sensing capacitors are not selected. The circuit illustrated by FIG. 1 is configured to measure the capacitance of two paralleled sensing capacitors out of the three sensing capacitors during one measurement (or integration cycle) instead of just one sensing capacitor as it is the case in common systems. As a consequence every measurement yields the sum of two out of three sensor capacitances. Summing in this case acts as a FIR low-pass filter meant to remove high frequent noise like high frequent carrier residues in smartcard applications. If switch S3L is closed the voltage comparator 101 is used to compare the voltage across Cint with a suitable reference voltage Vref. Vref may also be the trip point voltage of a GPIO input buffer. In the following Figures, X may refer to a driving node to which the driving signal may be applied, Z may refer to a sensing node where the voltage may be sensed and S may refer to a switching node. In FIG. 1, all sensing capacitors Cs are coupled to a driving node, wherein a driving signal is present at these nodes, if the correspondent switches S1$i$H and S1$i$L are closed.

Figure 2:
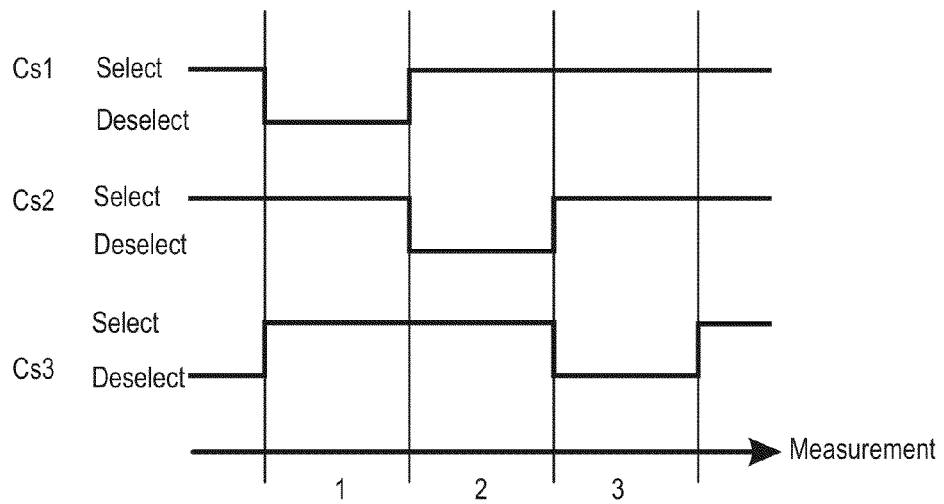
FIG. 2 illustrates a timing diagram indicating the sensor capacitor selection in the system of FIG. 1.

FIG. 2 is a simplified timing diagram illustrating the logical selection of sensor capacitors in a complementary sampling unit as illustrated by FIG. 1. The complementary sampling unit performs in this example a sequence of three measurements as depicted by FIG. 2 wherein each of the sensor capacitors is not selected during one measurement interval. After one complete measurement sequence comprising three measurements, the capacitance of each sensor may be retrieved by a set of arithmetic calculations.

FIG. 3 illustrates in detail the functional steps that may be required to operate a complementary sampling unit according to the embodiment illustrated by FIG. 1. The table indicates when the involved switches S11H, S11L, S12H, S12L, S13H, S13L, S12H, S12L, S3H and S3L have to be closed. A closed switch is indicated by an "X". A measurement sequence starts with the definition of the initial integration condition in step A by resetting the integration capacitor Cint. After that, the steps B, C, D, E, F and G are periodically executed until a measurement F results in an integration voltage above a predefined voltage threshold which concludes the actual measurement. After that, a new measurement is started with a different combination of sensing capacitors. After three measurements, the individual capacitance values can be calculated. As stated before, the amount of measurements required for the calculation of the individual capacitances may depend on the configuration of the complementary sampling unit.

FIGS. 4 and 5 illustrate the charging step (FIG. 4) and the reverse step (FIG. 5). With reference to FIG. 1 the parasitic capacitance of node S, Cpars, and the parasitic capacitances of node Z, Cparz, are combined into a total parasitic capacitance Cpar=Cparz+Cpars for simplification in further considerations. As can be seen, the sensing capacitor Cs and the combined parasitic node capacitance of node Z and node S, Cpar, are connected in parallel. They are used as a fly capacitor in a switched capacitor filter configuration. The charge being moved into the integration capacitor Cint is in good approximation $\Delta Q\text{cint} \sim (Vcc-Vcint)*(Cs+Cparz+Cpars)$. The charge being removed from the integration capacitor Cint during the reverse step is in good approximation $\Delta Q\text{cint} \sim Vcc*Cs$. Discharging is independent of the voltage across the integration capacitor and can be regarded as a touch-dependent current that discharges the integration capacitor. If added and removed charging of the capacitor is equal in size, the integration capacitor voltage will not increase any further. This voltage Vcint_max is in good approximation $V\text{cint\_max}=Vcc*(Cparz+Cpars)/(Cs+Cparz+Cpars)$. The combined parasitic capacitance Cpar should be as small as possible in order to achieve a good sensor sensitivity. Reference numbers 21 and 22 represent virtual voltage sources.

Figure 6:
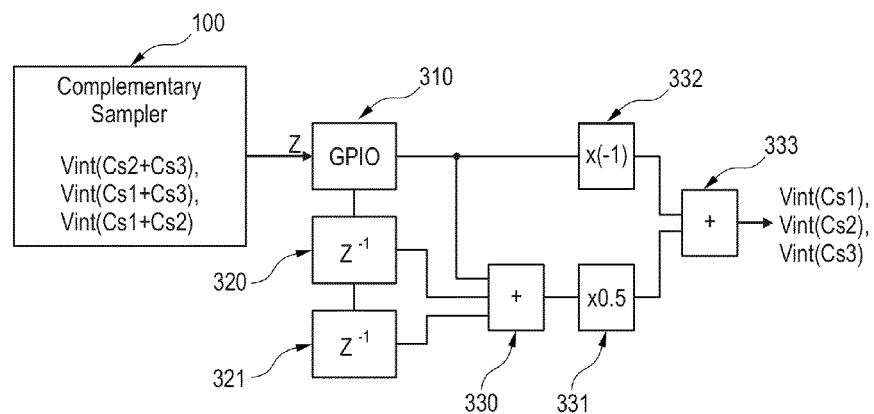
FIG. 6 illustrates a FIR noise filter configuration based on the system of FIG. 1.

FIG. 6 is a simplified schematic illustration of the complete FIR filter structure comprising the complementary sampling unit 100, a GPIO 310 used as voltage comparator and two delay elements 320 and 321. The example below indicates the calculation process for a complementary sampling unit with three sensor capacitors and with two sensor capacitances being measured at the same time:

Measurement at $t_{Cs1}$ yields $\Sigma 1 = Cs2+Cs3$
Measurement at $t_{Cs2}$ yields $\Sigma 2 = Cs1+Cs3$
Measurement at $t_{Cs3}$ yields $\Sigma 3 = Cs1+Cs2$ The capacitance of every sensing capacitor may be retrieved by:

$\Sigma\text{tot} = \Sigma 1 + \Sigma 2 + \Sigma 3$ $Cs1 = \Sigma\text{tot}/2 - \Sigma 1$ $Cs2 = \Sigma\text{tot}/2 - \Sigma 2$ $Cs3 = \Sigma\text{tot}/2 - \Sigma 3$ Adder 330 provides the sum of three measurements being taken in a row. The multipliers 331 and 332 apply the required weights and finally adder 333 yields the filtered measurement results for the individual capacitance. The FIR-filter efficiently removes high frequent Gaussian noise components while leaving the baseband signal unaffected.

Figure 7:
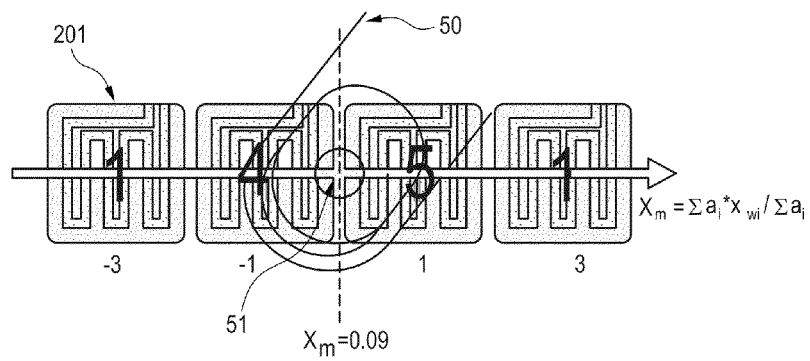
FIG. 7 illustrates the application of the center of gravity principle on a horizontal slider configuration made from four proximity sensing capacitors, according to an embodiment of the invention.

FIG. 7 illustrates a method of evaluating a position in a one-dimensional plane by applying a modified center of gravity formula. The embodiment shown in FIG. 7 is based on a horizontal slider with four sensing capacitors. The capacitances are measured using a complementary sampling unit illustrated by FIG. 20. If a human finger 50 is in close proximity to the sensor array 201, capacitance deviations of the sensor capacitors are measured. These measurement results represent activity levels that are related to the strength of the capacitance variation. These activity levels are multiplied with the sensors position weight factors in X-direction. According to the herein described system and method, the origin of the X-weight-scale is positioned exactly in the middle of the sensor array 201, which avoids asymmetric noise contributions. The X-position is calculated from the four activity levels ai:

$Xm = \Sigma ai*Xwi/\Sigma a$

Figure 8:
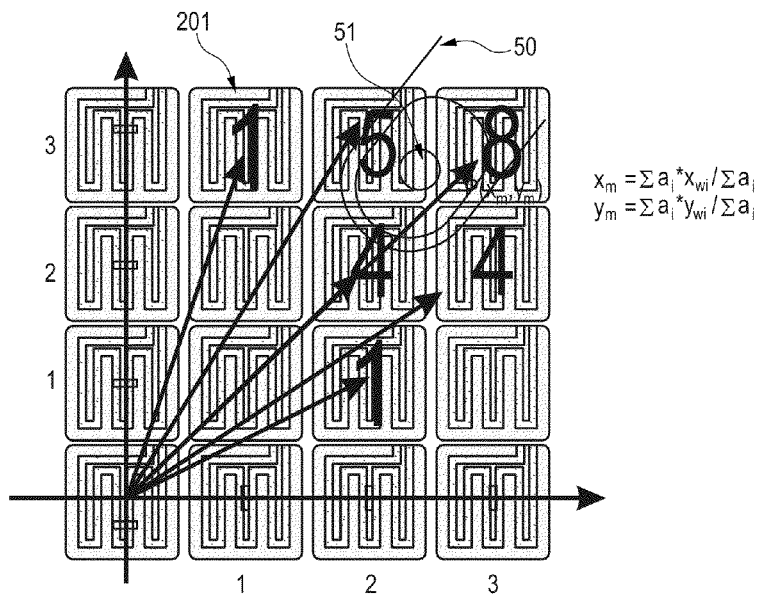
FIG. 8 illustrates the application of the center of gravity principle on a two-dimensional touch sensor configuration made from 16 proximity sensing capacitors, according to an embodiment of the invention.

FIG. 8 illustrates a method of evaluating a position in a two-dimensional plane by applying a modified center of gravity formula. The embodiment as shown in FIG. 8 is based on a horizontal slider with 16 sensing capacitors. The capacitances are measured using a complementary sampling unit similar to FIG. 20 but with 16 sensor capacitors. The measured capacitance deviations are represented by an activity level that is related to the strength of capacitance variation. These activity levels are multiplied with the sensors position weight factors in x- and y-direction. According to the herein described system and method, the origin of the weight scale is positioned exactly in the geometrical center of the sensor array 201, which avoids asymmetric noise contributions. The X- and Y-positions are calculated from the 16 activity levels ai:

$$Xm = \Sigma ai * Xwi / \Sigma ai$$

$$Ym = \Sigma ai * Ywi / \Sigma ai$$

Figure 9:
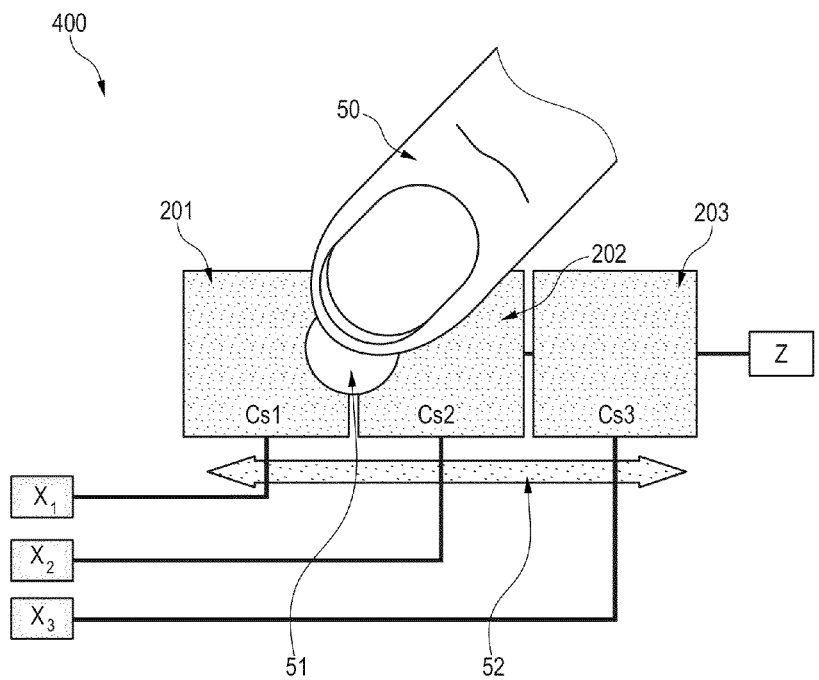
FIG. 9 illustrates an embodiment of a one-dimensional position sensor based on the system illustrated by FIG. 1.

FIG. 9 illustrates an embodiment of a one-dimensional slider based on the complementary sampling unit according to FIG. 1. The sensor array comprises three un-weighted sensor capacitors 201, 202 and 203. The touch position 51 caused by a finger 50 in close proximity is calculated applying the principles illustrated by FIG. 8.

Figure 10:
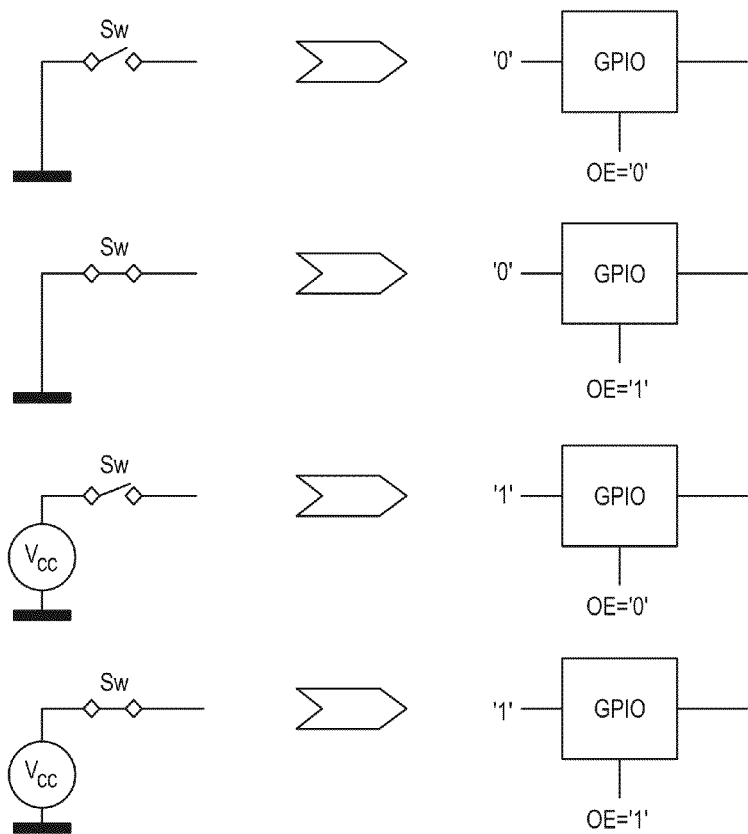
FIG. 10 illustrates GPIOs used as switches connected to ground or to the DC supply voltage, according to an embodiment of the invention.

FIG. 10 illustrates how switches in switched capacitor integrators that may be connected to ground or to the DC supply voltage can be substituted by GPIOs. An open switch may be implemented by a GPIO with the output being switched to tri-state (high-impedance), OE='0'. A closed switch connected to ground may be implemented by a GPIO with its output being enabled (OE='1') and the input value being set to a logic "LOW"-level. A closed switch connected to digital supply voltage level is implemented by a GPIO with its output being enabled and the input value being set to a logic "HIGH"-level.

Figure 11:
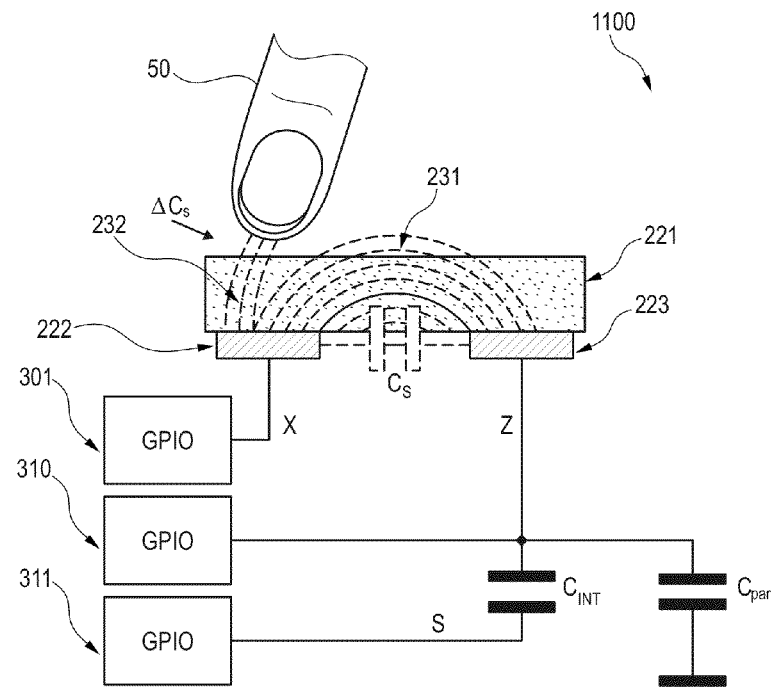
FIG. 11 illustrates an embodiment of a capacitance measurement circuit for capacitive proximity sensors based on a GPIO controlled switched capacitor filter, according to an embodiment of the invention.

FIG. 11 illustrates a proximity sensing capacitor Cs in a sampling unit 1100 being operated in a switched capacitor integrator configuration with the purpose of measuring the capacitance of the sensing capacitor Cs. The sensor capacitor Cs is formed by two electrodes 222 and 223 attached to a substrate 221. The electrodes 222 and 223 are very thin (3-50 µm) compared to the thickness of the substrate 221 (200-1000 µm). As a consequence the direct plate capacitance of the capacitor Cs is small compared to its fringe capacitance. The fringe field of capacitor Cs is indicated by 231. A human finger in close proximity with the substrate 221 causes a distortion 232 of the fringe field. This distortion reduces the capacitance of the sensing capacitor Cs. GPIO 301, 310 and 311 are in conjunction with the sensing capacitor Cs configured to periodically charge and discharge the integration capacitor Cint. The amount of charge being coupled through the sensor capacitor Cs into the integration capacitor depends on the capacitance of the sensor capacitor Cs and the actual voltage across the integration capacitor and the amount of charge being removed from the integration capacitor depends on the capacitance of the sensor capacitor and is independent of the actual voltage across the integration capacitor Cint. The combined parasitic capacitance at node Z and node S caused e.g. by wiring capacitances or the output capacitances of GPIO 310 and GPIO 311 respectively are here considered by the capacitor Cpar. During charging of Cint the capacitor Cpar may be regarded as being in parallel to the sensing capacitor. With increasing voltage across the integration capacitor Cint less charge is coupled to the integration capacitor.

Figure 12:
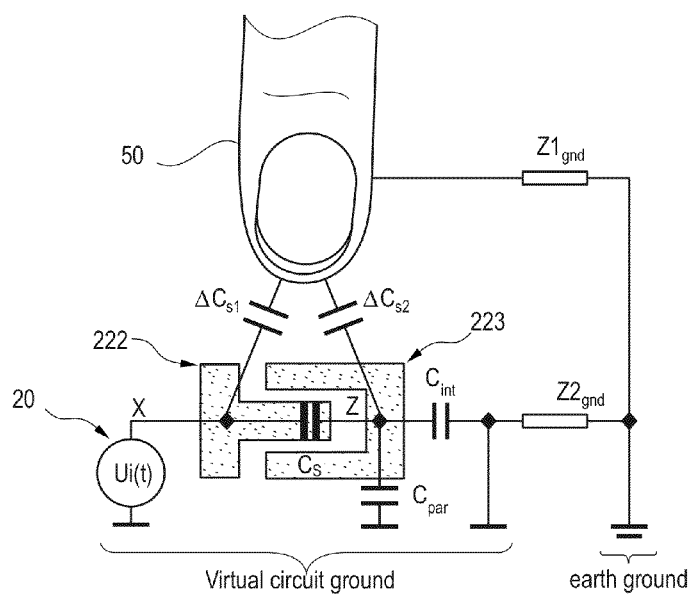
FIG. 12 illustrates the capacitances being present when a human finger is in close proximity to a sensor capacitor, according to an embodiment of the invention.

FIG. 12 is a simplified model of a capacitive sensor touched by a human finger 50. The capacitance variation caused by the finger is illustrated by the capacitors $\Delta Cs1$ and $\Delta Cs2$. The capacitor Cint is the integration capacitor. The impedances Z1gnd from the human body to earth ground potential and the impedance Z2gnd from earth ground potential to the sensors circuit ground model the back current loop for $\Delta Cs1$ and $\Delta Cs2$. Reference number 20 illustrates a X driver source.

Figure 13:
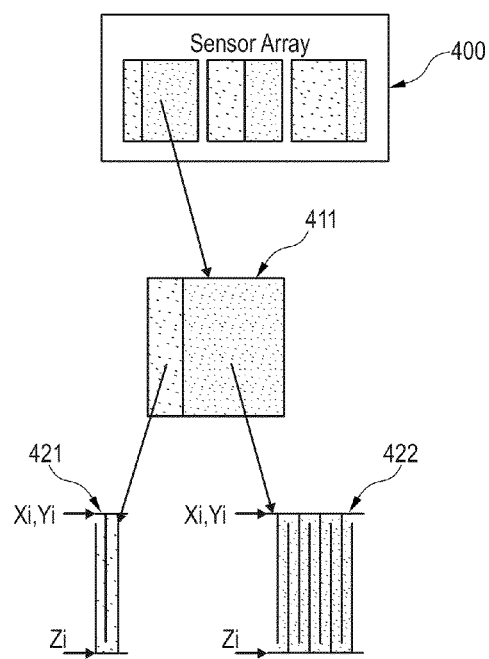
FIG. 13 illustrates various components of a sensor array comprising weighted sensor elements made from weighted sensor capacitors, according to an embodiment of the invention.

It is one idea of the herein described method and system to simplify the implementation of one- and two-dimensional position sensing devices. In order to reduce the amount of GPIOS required for the sensor implementation, the weights being applied by the center of gravity algorithm are partially applied to the sensor structure by implementing weighting and summing directly. Some definitions for better understanding of the principle are given by FIG. 13. FIG. 13 depicts a sensor array 400 corresponding to the sensitive area as mentioned above. The sensor array comprises the complete sensor structure configured to generate position dependent capacitance variations. This sensor array 400 comprises multiple weighted sensor elements 411 (or sensing elements) with each weighted sensor element 411 comprises multiple weighted sensor capacitors, which in the depicted embodiment are the sensor capacitors 421 and 422. However, each sensor element may also comprise more than two capacitors.

Figure 14:
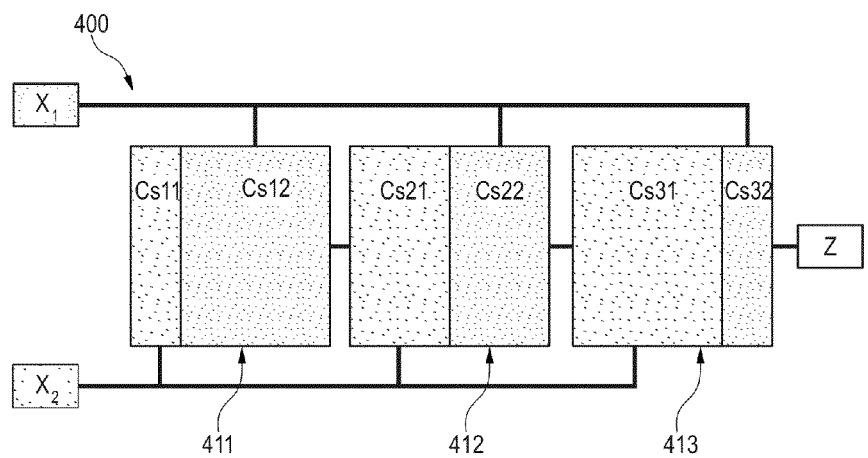
FIG. 14 illustrates an embodiment of a one-dimensional horizontal slider created from three weighted sensor elements each with two weighted sensor capacitors, according to an embodiment of the invention.

FIG. 14 illustrates a one-dimensional position sensor comprising three weighted sensor elements 412, 412 and 414, each of them comprising a first and a second weighted sensor capacitor. The capacitances of the first and the second weighted sensor capacitor of one sensor element sum up to a constant capacitance value. The size of the sensor capacitors capacitances represents the position weight assigned to that sensor element. In the configuration indicated by FIG. 14, three sensor elements are provided with the weights assigned as given below:

| Weighted Sensor element # | X-Position | Weight of first weighted Sensor Capacitor | Weight of second weighted Sensor Capacitor |
|---|---|---|---|
| 1 | −1 | 0.25 | 0.75 |
| 2 | 0 | 0.5 | 0.5 |
| 3 | 1 | 0.75 | 0.25 |

In the configuration according to FIG. 14, all first weighted sensor capacitors are connected to signal Cx1, all second weighted sensor capacitors are connected to signal Cx2. Measuring both capacitances Cx1 and Cx2 may allow a precise determination of the relative touch position.

The capacitances measured at the nodes Cx1 and Cx2 represent a scaled weighted average of all sensor capacitor activity levels connected to the same node. Normalization is achieved during the position calculation by dividing the values of Cx1 and Cx2 by the sum of Cx1 and Cx2:

$$x = Cx1 / (Cx1 + Cx2)$$

$$1 - x = Cx2 / (Cx1 + Cx2)$$

x represents the relative position in x-direction and (1−x) represents the complementary x position. According to the herein described method and system, the position x is for numerical precision calculated from the larger of the two values Cx1 and Cx2.

Figure 15:
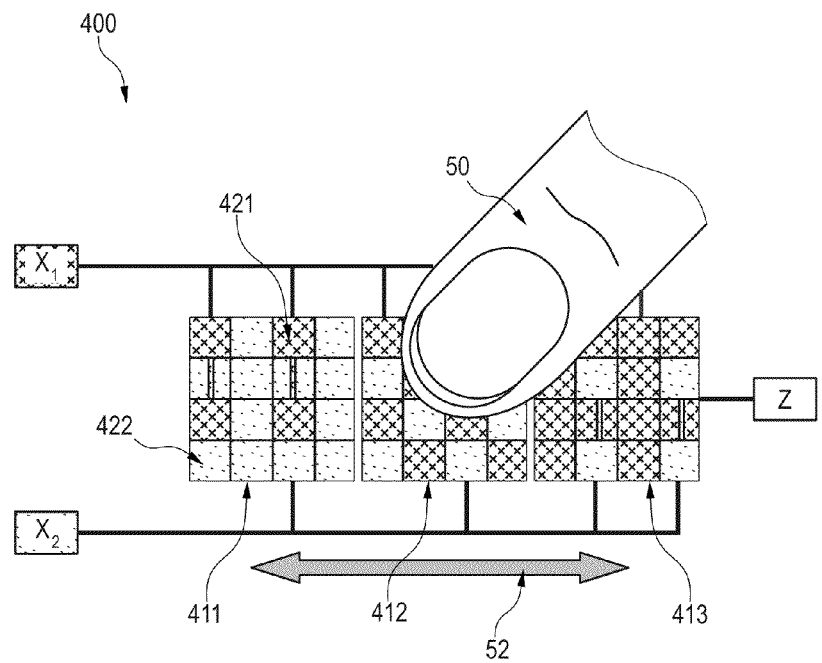
FIG. 15 illustrates an embodiment of a one-dimensional horizontal slider created from three weighted sensor elements with weights implemented by interleaved unit sensor capacitors, according to an embodiment of the invention.

FIG. 15 represents an implementation of the one-dimensional sensor of FIG. 14 with three weighted sensor elements 411, 412 and 413 wherein the weighted sensor capacitors 421 and 422 may be created from unit capacitors that are evenly distributed over each sensor element area according to the required weights. The purpose of this embodiment is to determine the position of a human finger 50 during a horizontal movement 52 in close proximity with the sensor.

Figure 16:
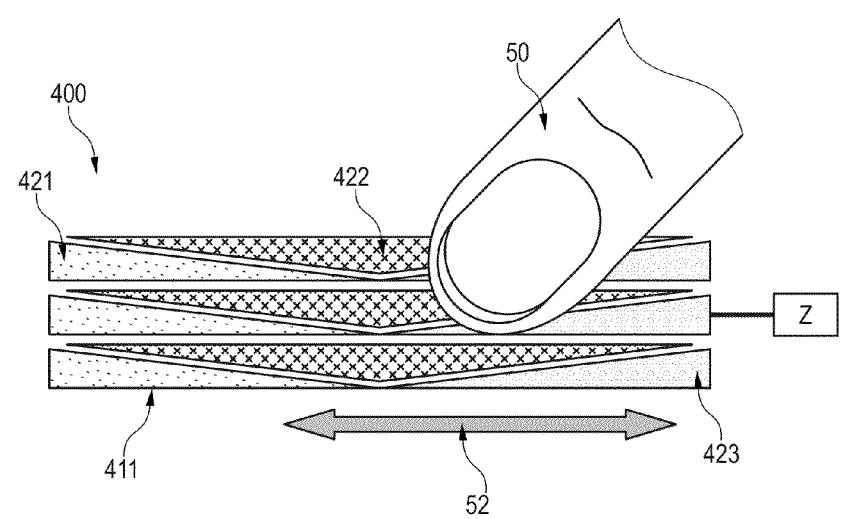
FIG. 16 illustrates an embodiment of a one-dimensional horizontal slider created from three paralleled weighted sensor elements comprising three triangle shaped sensor capacitors, according to an embodiment of the invention.

FIG. 16 indicates a one-dimensional sensor structure comprising three parallel sensor arrays, each comprising three triangular shaped sensor capacitors 421, 422 and 423 connected to the signal lines X1, X2 and X3. This sensor structure may provide an economic implementation of a one-dimensional position sensor. The position of a human finger 50 during a horizontal movement 52 is calculated as mentioned above.

Figure 17:
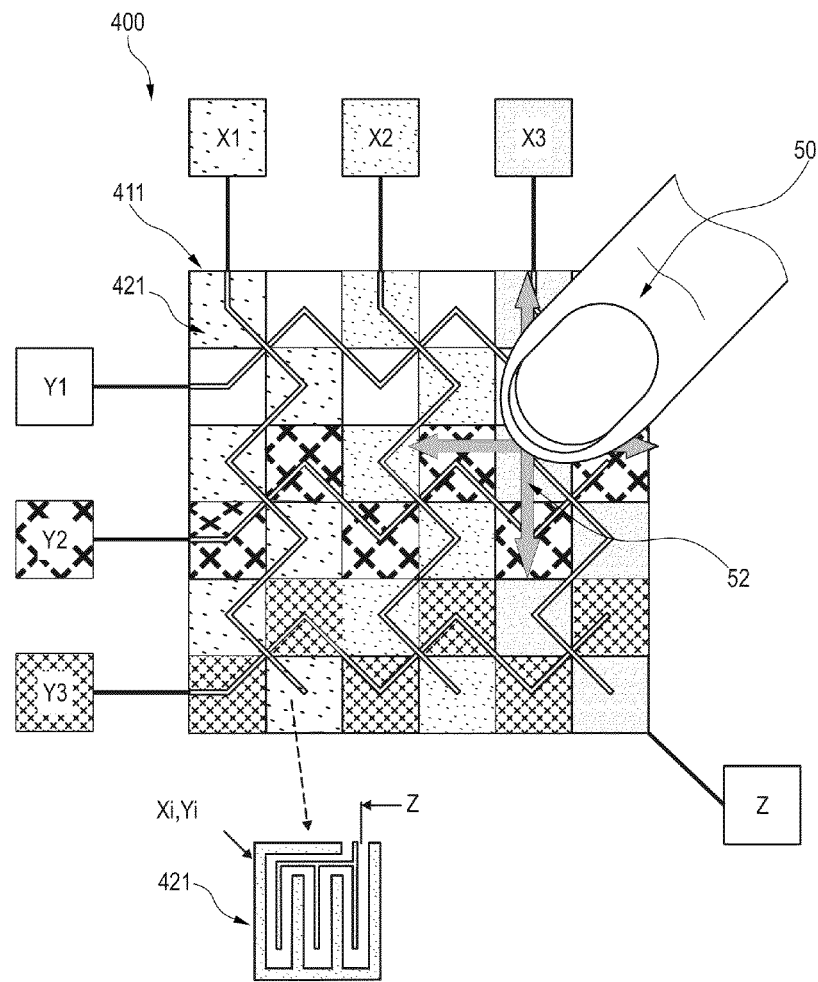
FIG. 17 illustrates an embodiment of a two-dimensional touch sensor array created from six un-weighted sensor elements each implemented by six unit sensor capacitors, according to an embodiment of the invention.

FIG. 17 represents an embodiment 400 of a two-dimensional position sensor, based on three interleaved sensor capacitors in x-direction and three interleaved sensor capacitors in y-direction. The six capacitors are formed by unit sensor capacitors 421. A complementary sampling unit according to FIG. 21 may be used to measure the six sensing capacitors. The position of a human finger 50 may be detected in a two dimensional plane 52.

Figure 18:
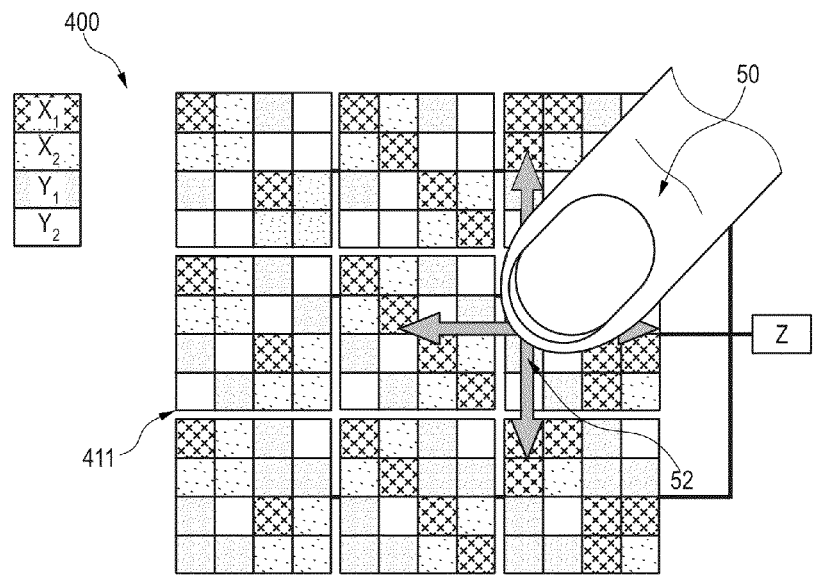
FIG. 18 illustrates an embodiment of a two-dimensional touch sensor array created from nine weighted sensor elements with weights in x- and y-direction each implemented by 16 interleaved unit capacitors, according to an embodiment of the invention.

FIG. 18 represents an embodiment 400 of a two-dimensional position sensor, based on nine sensor elements with four weighted sensor capacitors each wherein the weights are applied by in total 16 unit capacitors each. Weights are applied as indicated, using the exemplary weighting factors 0.25, 0.50 and 0.75 repeatedly in x- and y-direction. Node Z is the summing node. According to the herein described method and system, the four sensing capacitors Cx1, Cx2, Cy1 and Cy2 are measured utilizing a complementary sampling unit according to FIG. 20. As a result, 75% of all weighted sensor capacitors may be evaluated in one measurement. The position components x and y may be calculated as:

$$x=Cx1/(Cx1+Cx2)$$

$$1-x=Cx2/(Cx1+Cx2)$$

$$y=Cy1/(Cy1+Cy2)$$

$$1-y=Cy2/(Cy1+Cy2)$$

Figure 19:
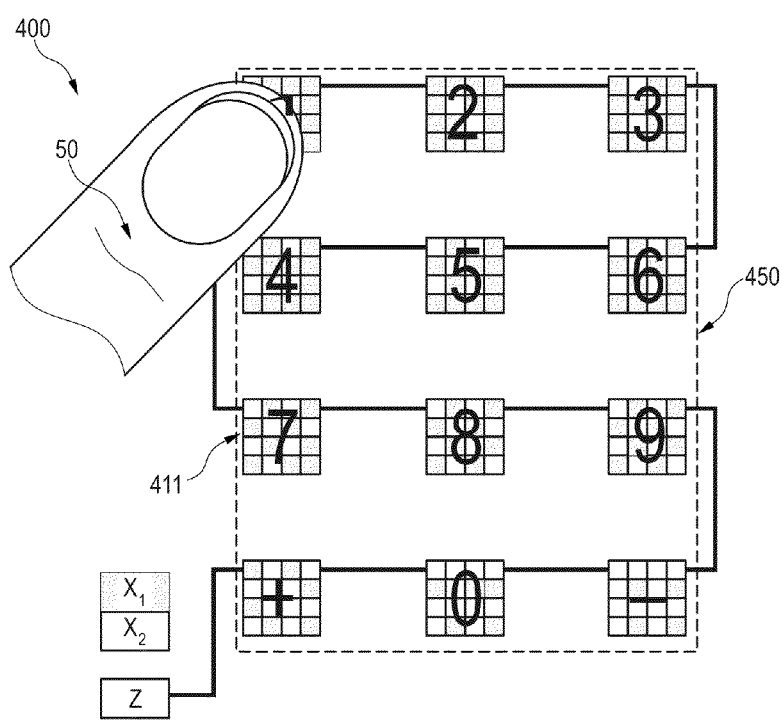
FIG. 19 illustrates an embodiment of a keypad implemented by a one-dimensional slider structure made from 12 weighted sensor elements each with 16 interleaved unit capacitors, according to an embodiment of the invention.

The principle described here may be applied to sensor arrays of any size and any amount of weighted sensor elements. The position resolution depends on the amount of weighted sensor elements and the achievable matching of the unit capacitors. FIG. 19 indicates an embodiment representing a keypad. The keypad 450 comprises a sensor array comprising 12 weighted sensor elements 411 meant to identify key presses by a human finger 50 at certain predefined locations. The keypad according to the herein described method and system may be configured as a meandered one-dimensional position sensor with unique weights assigned to each keypad location. Weighting may be assigned by using unit capacitors as indicated to assign unique weights.

Figure 20:
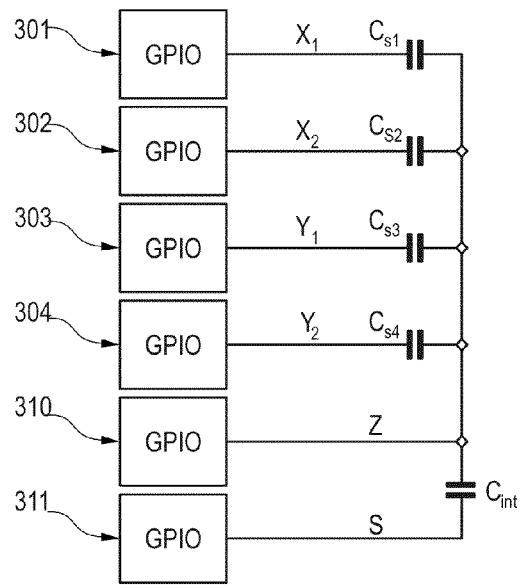
FIG. 20 illustrates the GPIO structure being used to implement a two-dimensional position sensor utilizing the sensor structure of FIG. 18.
Figure 21:
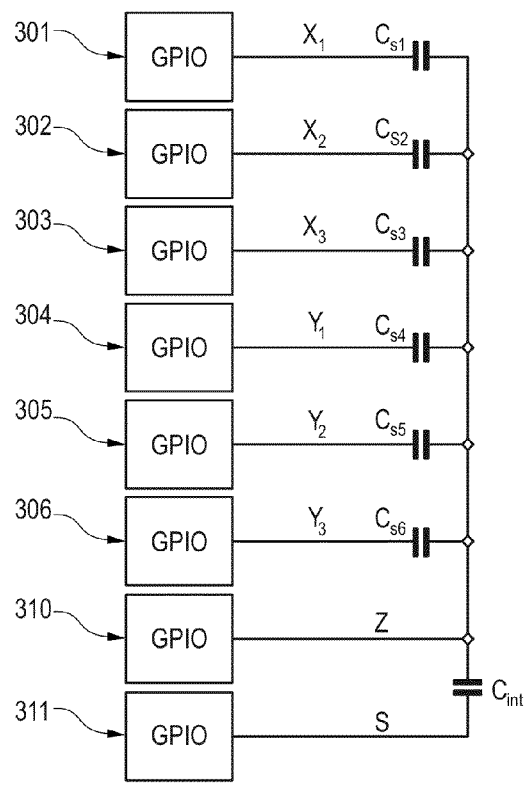
FIG. 21 illustrates the GPIO structure being used to implement a two-dimensional position sensor utilizing the sensor structure of FIG. 18.

FIG. 20 illustrates an embodiment of a complementary sampling unit with four sensor capacitors. The GPIOs 301-304, 310 and 311 are configured to implement one-dimensional and two-dimensional position detectors. FIG. 21 illustrates the GPIO structure required to implement the two-dimensional position detector of FIG. 17.

Figure 22:
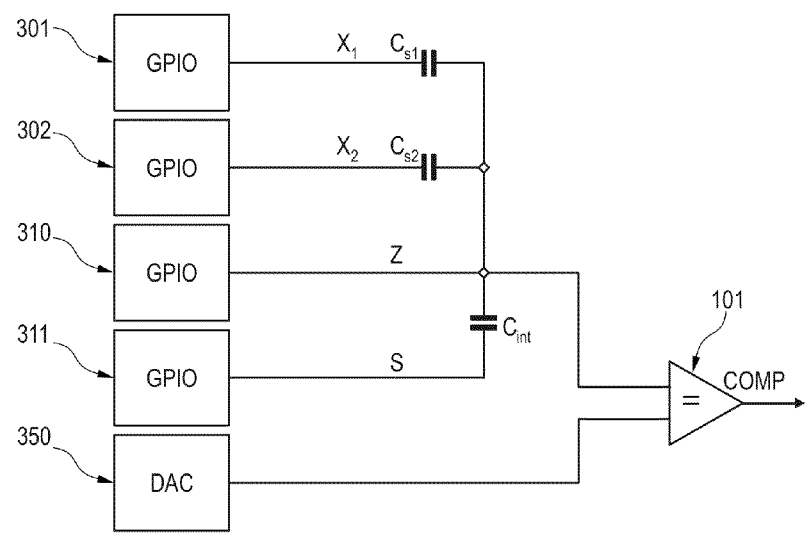
FIG. 22 illustrates the GPIO structure utilizing a digital to analog converter (DAC) to generate a software controlled reference level comparison, according to an embodiment of the invention.

FIG. 22 is an embodiment of a sampling unit utilizing a software programmable comparator 101 that may be used to speed up the measurement process. The reference voltage is provided by an internal digital to analog converter (DAC) 350. Normally, it takes some time to switch the GPIO 310 from output to input mode. Skipping the measurement step for a certain amount of cycles may speed up the integration. The programmable comparator may be used to detect the voltage level at which the measurement has to be enabled. Another purpose of the programmable comparator according to the herein described method and system is to implement an adaptable reference level that is set sufficiently below the maximum voltage across the integration capacitor Cint.

The herein described method and system may enable the creation of a low power, low complexity touch based user interfaces for a variety of applications.

To suppress unauthorized communication with a contactless smartcard, a one-dimensional touch sensor interface may be embedded into a contactless smartcard. A one-dimensional position sensor according to FIG. 15 may be used to identify a horizontal sweep of a human finger on the surface of the smartcard. The smartcards communication interface stays deactivated until it gets deliberately activated with a horizontal finger movement over the sensing area by the card holder.

A two-dimensional position sensor may be used to provide a touch interface on a smartcards surface. An electronic ID-Card may be equipped with a two-dimensional position sensor according to FIG. 17 or 18. The sensor may be used to enter a Personal Identification Number (PIN) directly on the smartcard's surface by drawing the PIN with a finger or a stylus. The two-dimensional position sensor provides a stream of position data to an online-handwriting recognition that retrieves the entered digits. This approach may make external keypads obsolete and furthermore may avoid skimming the PIN on the way from the keypad to a host application since the PIN never leaves the smart card unencrypted. In this scenario, the PIN can either be entered via touch buttons that represent different characters or by gesture recognition where different gestures represent different characters. This authentication method is especially beneficial if an external secure keypad for PIN entry cannot be provided. The use case is quite common in secure online authentication, e.g., in online payment.

In case just a keypad interface is required the keypad according to FIG. 19 can be applied, which is based on a one-dimensional slider implementation. This keypad may be implemented on generic MCUs with minimum number of GPIOs. The overhead for implementing the touch sensor reduces to a minor increase in the software footprint.

Figure 23:
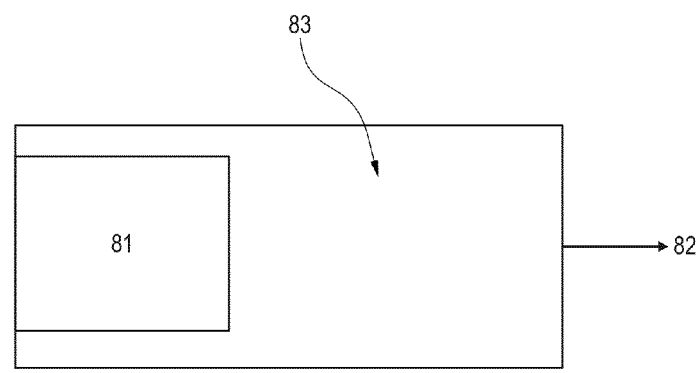
FIG. 23 illustrates the implementation of a capacitive position sensor system according to an embodiment of the invention.

FIG. 23 is an embodiment that represents several implementations of the capacitive sensor interface. The capacitive sensor interface may be integrated into a MCU 80 with a programmable state machine 81. The integration of the capacitive sensor interface utilizing a programmable state machine offloads the CPU from timing critical tasks and furthermore reduces the power consumption of the MCU which is crucial for smartcard which are powered by the electromagnetic field of a reader device. In another embodiment, the capacitive sensor interface 81 may be integrated directly into a Secure Element 81 comprising a cryptographic processor. The integration of the capacitive proximity sensor interface into the Secure Element avoids insecure connections between a capacitive sensor device and a secure element. The output of the secure element is directly encrypted data.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A capacitive position sensor system for determining the position of an object, wherein the object is positioned within a sensitive area of the capacitive position sensor system and changes the capacitance of capacitors being arranged underneath the object, the capacitive position sensor system comprising a first plurality of sensing elements, each sensing element comprising a first capacitor having a first electrode and a second electrode, wherein each first electrode is coupled via a switch to a voltage supply to form a switched capacitor filter, wherein the switch for each first capacitor is located between the voltage supply and the first electrode of each first capacitor, and wherein the second electrodes are coupled to form a sensing line, a sensing unit, wherein the sensing unit is adapted to sense a voltage level representing the amount of charge being present on the sensing line, and a control unit, wherein the control unit is adapted to apply a drive signal to each of the switches being coupled to the first electrodes, wherein, in one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two, wherein the control unit is adapted to determine the position of the object by analyzing the results of a plurality of sensed voltage levels of a plurality of integration cycles.

2. The capacitive position sensor system according to claim 1, wherein analyzing the results of a plurality of sensed voltage levels comprises computing the charge of each of the first capacitors.

3. The capacitive position sensor system according to claim 1, wherein the sensing unit and the control unit provides a n-tap FIR noise filter by driving at least two capacitors in one integration cycle.

4. The capacitive position sensor system according to claim 1, wherein the number of integration cycles corresponds to the number of capacitors.

5. The capacitive position sensor system according to claim 1, wherein the sensing unit comprises an integration capacitor being indicative for the sum of the amount of charge of the part of the first capacitors, and a comparator for comparing the voltage level sensed via the integration capacitor with a reference voltage.

6. The capacitive position sensor system according to claim 5, wherein the comparator is a general purpose input/output pin being controlled as a comparator and/or a voltage comparator.

7. The capacitive position sensor system according to claim 1, wherein each of the switches is a general purpose input/output pin being controlled as a switch.

8. The capacitive position sensor system according to claim 1, the capacitive position sensor system further comprising a second plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, wherein, in one integration cycle, a part of the switches being coupled to the first electrodes is closed so that a part of the first capacitors of the second plurality of sensing elements is driven by a second drive signal, wherein the sensing unit is adapted to sense the voltage level representing the sum of the amount of charge of the part of the first capacitors of the first plurality of sensing elements and the voltage level representing the sum of the amount of charge of the part of the first capacitors of the second plurality of sensing elements.

9. The capacitive position sensor system according to claim 1, wherein each sensing element of the first plurality of sensing elements comprises a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the second electrodes is closed so that a part of the second capacitors is driven by a second drive signal, wherein the sensing unit is adapted to sense the voltage level representing the sum of the amount of charge of the part of the first capacitors and the voltage level representing the sum of the amount of charge of the part of the second capacitors, wherein the control unit is adapted to determine the position of the object by analyzing the results of a plurality of sensed voltage levels for the first capacitors and the second capacitors of a plurality of integration cycles.

10. The capacitive position sensor system according to claim 9, the capacitive position sensor system further comprising a second plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line wherein each sensing element of the second plurality of sensing elements comprises a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the first electrodes and a part of the switches being coupled to the second electrodes is closed so that a part of the first capacitors of the first plurality of sensing elements is driven by a first drive signal, a part of the second capacitors of the first plurality of sensing elements is driven by a second drive signal, a part of the first capacitors of the second plurality of sensing elements is driven by a third drive signal, and a part of the second capacitors of the second plurality of sensing elements is driven by a fourth drive signal, wherein the sensing unit is adapted to sense the voltage level representing the sum of the amount of charge of the part of the first capacitors of the first plurality of sensing elements, to sense the voltage level representing the sum of the amount of charge of the part of the second capacitors of the first plurality of sensing elements, to sense the voltage level representing the sum of the amount of charge of the part of the first capacitors of the second plurality of sensing elements, and to sense the voltage level representing the sum of the amount of charge of the part of the second capacitors of the second plurality of sensing elements, wherein the control unit is adapted to determine the position of the object by analyzing the results of a plurality of sensed voltage levels of a plurality of integration cycles.

11. The capacitive position sensor system according to claim 10, wherein the first plurality of sensing elements is arranged in rows and the second plurality of sensing elements is arranged in columns to form a two-dimensional array.

12. An electronic device for receiving an input from a user, the electronic comprising the capacitive position sensor system according to claim 1, wherein the input corresponds to the positioning of an object of the user.

13. The electronic device according to claim 12, wherein the electronic device is a keypad, a smart card or a mobile device.

14. The electronic device according to claim 12, wherein the capacitive position sensor system is integrated in a secure element of the electronic device.

15. A method of determining the position of an object, wherein the object is positioned within a sensitive area of the capacitive position sensor system and changes the capacitance of capacitors being arranged underneath the object, wherein the capacitive position sensor system comprises a first plurality of sensing elements, each sensing element comprising a first capacitor having a first electrode and a second electrode, wherein each first electrode is coupled via a switch to a voltage supply to form a switched capacitor filter, wherein the switch for each first capacitor is located between the voltage supply and the first electrode of each first capacitor, and wherein the second electrodes are coupled to form a sensing line, the method comprising sensing, by a sensing unit, a voltage level representing the amount of charge being present on the sensing line, applying, by a control unit, a drive signal to each of the switches being coupled to the first electrodes, wherein, in one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two, determining, by the control unit, the position of the object by analyzing the results of a plurality of sensed voltage levels of a plurality of integration cycles.

16. A capacitive position sensor system for determining the position of an object, wherein the object is positioned within a sensitive area of the capacitive position sensor system and changes the capacitance of capacitors being arranged underneath the object, the capacitive position sensor system comprising a first plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line, a sensing unit, wherein the sensing unit is adapted to sense a voltage level representing the amount of charge being present on the sensing line, and a control unit, wherein the control unit is adapted to apply a drive signal to each of the switches being coupled to the first electrodes, wherein, in one integration cycle, a part of the switches being coupled to the first electrodes is closed so that a part of the first capacitors is driven by a first drive signal, wherein the sensing unit is adapted to sense the voltage level representing the sum of the amount of charge of the part of the first capacitors, wherein the number of the switches being closed is at least two, wherein the control unit is adapted to determine the position of the object by analyzing the results of a plurality of sensed voltage levels of a plurality of integration cycles, wherein each sensing element of the first plurality of sensing elements comprises a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the second electrodes is closed so that a part of the second capacitors is driven by a second drive signal, wherein the sensing unit is adapted to sense the voltage level representing the sum of the amount of charge of the part of the first capacitors and the voltage level representing the sum of the amount of charge of the part of the second capacitors, wherein the control unit is adapted to determine the position of the object by analyzing the results of a plurality of sensed voltage levels for the first capacitors and the second capacitors of a plurality of integration cycles.

17. The capacitive position sensor system according to claim 16, the capacitive position sensor system further comprising a second plurality of sensing elements, each sensing element comprising a first capacitor having a first electrode and a second electrode, wherein each first electrode is coupled via a switch to a voltage supply to form a switched capacitor filter, wherein the second electrodes are coupled to form a sensing line wherein each sensing element of the second plurality of sensing elements comprises a second capacitor having a first electrode and a second electrode, wherein each first electrode is coupled via a switch to the voltage supply to form a switched capacitor filter, wherein the second electrodes are coupled to form a further sensing line, wherein a specific weighting factor is assigned to each capacitor, wherein the capacitances of the first and the second capacitor of one sensing element corresponds to a constant capacitance value, wherein, in one integration cycle, a part of the switches being coupled to the first electrodes and a part of the switches being coupled to the second electrodes is closed so that a part of the first capacitors of the first plurality of sensing elements is driven by a first drive signal, a part of the second capacitors of the first plurality of sensing elements is driven by a second drive signal, a part of the first capacitors of the second plurality of sensing elements is driven by a third drive signal, and a part of the second capacitors of the second plurality of sensing elements is driven by a fourth drive signal, wherein the sensing unit is adapted to sense the voltage level representing the sum of the amount of charge of the part of the first capacitors of the first plurality of sensing elements, to sense the voltage level representing the sum of the amount of charge of the part of the second capacitors of the first plurality of sensing elements, to sense the voltage level representing the sum of the amount of charge of the part of the first capacitors of the second plurality of sensing elements, and to sense the voltage level representing the sum of the amount of charge of the part of the second capacitors of the second plurality of sensing elements, wherein the control unit is adapted to determine the position of the object by analyzing the results of a plurality of sensed voltage levels of a plurality of integration cycles.

18. The capacitive position sensor system according to claim 17, wherein the first plurality of sensing elements is arranged in rows and the second plurality of sensing elements is arranged in columns to form a two-dimensional array.

* * * * *